(12) United States Patent
Li et al.

(10) Patent No.: US 11,004,897 B2
(45) Date of Patent: May 11, 2021

(54) MAGNETORESISTIVE RANDOM ACCESS MEMORY AND METHOD FOR FABRICATING THE SAME

(71) Applicant: UNITED MICROELECTRONICS CORP., Hsin-Chu (TW)

(72) Inventors: Kun-Ju Li, Tainan (TW); Tai-Cheng Hou, Tainan (TW); Hsin-Jung Liu, Pingtung County (TW); Fu-Yu Tsai, Tainan (TW); Bin-Siang Tsai, Changhua County (TW); Chau-Chung Hou, Tainan (TW); Yu-Lung Shih, Tainan (TW); Ang Chan, Taipei (TW); Chih-Yueh Li, Taipei (TW); Chun-Tsen Lu, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 16/531,108

(22) Filed: Aug. 4, 2019

(65) Prior Publication Data
US 2021/0005662 A1 Jan. 7, 2021

(30) Foreign Application Priority Data
Jul. 5, 2019 (TW) .................................. 108123743

(51) Int. Cl.
| | | |
|---|---|---|
| *H01L 29/82* | (2006.01) | |
| *H01L 27/22* | (2006.01) | |
| *H01L 43/12* | (2006.01) | |
| *H01F 41/34* | (2006.01) | |
| *G11C 11/16* | (2006.01) | |
| *H01F 10/32* | (2006.01) | |
| *H01L 43/02* | (2006.01) | |

(52) U.S. Cl.
CPC .......... *H01L 27/222* (2013.01); *G11C 11/161* (2013.01); *H01F 10/3254* (2013.01); *H01F 41/34* (2013.01); *H01L 43/02* (2013.01); *H01L 43/12* (2013.01)

(58) Field of Classification Search
None
See application file for complete search history.

(56) References Cited

U.S. PATENT DOCUMENTS

| | | | |
|---|---|---|---|
| 10,163,651 B1 * | 12/2018 | Chen | H01L 21/31055 |
| 2008/0026203 A1 | 1/2008 | Gates et al. | |
| 2019/0165260 A1 * | 5/2019 | Yu | H01F 41/308 |
| 2020/0212290 A1 * | 7/2020 | Wang | H01L 21/762 |

* cited by examiner

*Primary Examiner* — Hung K Vu
(74) *Attorney, Agent, or Firm* — Winston Hsu

(57) ABSTRACT

A method for fabricating semiconductor device includes the steps of: forming a first magnetic tunneling junction (MTJ) and a second MTJ on a substrate; forming a first top electrode on the first MTJ and a second top electrode on the second MTJ; forming a first ultra low-k (ULK) dielectric layer on the first MTJ and the second MTJ; forming a passivation layer on the first ULK dielectric layer, wherein a bottom surface of the passivation layer between the first MTJ and the second MTJ is lower than a top surface of the first MTJ; and forming a second ULK dielectric layer on the passivation layer.

7 Claims, 6 Drawing Sheets

US 11,004,897 B2

MAGNETORESISTIVE RANDOM ACCESS MEMORY AND METHOD FOR FABRICATING THE SAME

BACKGROUND OF THE INVENTION

1. Field of the Invention

The invention relates to a semiconductor device and method for fabricating the same, and more particularly to a magnetoresistive random access memory (MRAM) and method for fabricating the same.

2. Description of the Prior Art

Magnetoresistance (MR) effect has been known as a kind of effect caused by altering the resistance of a material through variation of outside magnetic field. The physical definition of such effect is defined as a variation in resistance obtained by dividing a difference in resistance under no magnetic interference by the original resistance. Currently, MR effect has been successfully utilized in production of hard disks thereby having important commercial values. Moreover, the characterization of utilizing GMR materials to generate different resistance under different magnetized states could also be used to fabricate MRAM devices, which typically has the advantage of keeping stored data even when the device is not connected to an electrical source.

The aforementioned MR effect has also been used in magnetic field sensor areas including but not limited to for example electronic compass components used in global positioning system (GPS) of cellular phones for providing information regarding moving location to users. Currently, various magnetic field sensor technologies such as anisotropic magnetoresistance (AMR) sensors, GMR sensors, magnetic tunneling junction (MTJ) sensors have been widely developed in the market. Nevertheless, most of these products still pose numerous shortcomings such as high chip area, high cost, high power consumption, limited sensibility, and easily affected by temperature variation and how to come up with an improved device to resolve these issues has become an important task in this field.

SUMMARY OF THE INVENTION

According to an embodiment of the present invention, a method for fabricating semiconductor device includes the steps of: forming a first magnetic tunneling junction (MTJ) and a second MTJ on a substrate; forming a first top electrode on the first MTJ and a second top electrode on the second MTJ; forming a first ultra low-k (ULK) dielectric layer on the first MTJ and the second MTJ; forming a passivation layer on the first ULK dielectric layer, wherein a bottom surface of the passivation layer between the first MTJ and the second MTJ is lower than a top surface of the first MTJ; and forming a second ULK dielectric layer on the passivation layer.

According to another aspect of the present invention, a semiconductor device includes: a first magnetic tunneling junction (MTJ) and a second MTJ on a substrate; a first top electrode on the first MTJ and a second top electrode on the second MTJ; a first ultra low-k (ULK) dielectric layer on the first MTJ and the second MTJ; a passivation layer on the first ULK dielectric layer, wherein a bottom surface of the passivation layer between the first MTJ and the second MTJ is lower than a top surface of the first MTJ; and a second ULK dielectric layer on the passivation layer.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
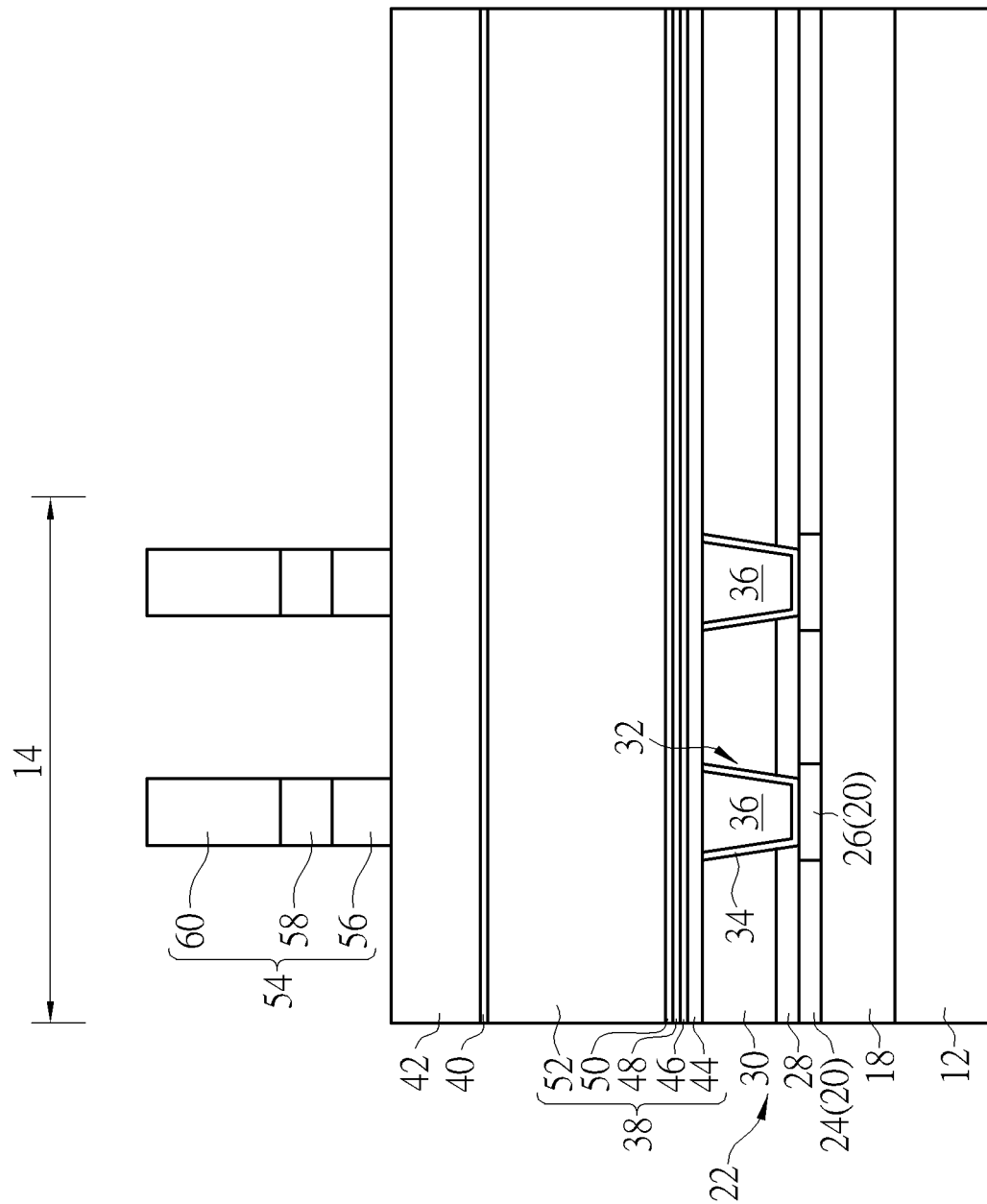
FIGS. 1-6 illustrate a method for fabricating a semiconductor device according to an embodiment of the present invention.

Referring to FIGS. 1-6, FIGS. 1-6 illustrate a method for fabricating a semiconductor device, or more specifically a MRAM device according to an embodiment of the present invention. As shown in FIG. 1, a substrate 12 made of semiconductor material is first provided, in which the semiconductor material could be selected from the group consisting of silicon (Si), germanium (Ge), Si—Ge compounds, silicon carbide (SiC), and gallium arsenide (GaAs), and a MTJ region 14 and a logic region 16 are defined on the substrate 12.

Active devices such as metal-oxide semiconductor (MOS) transistors, passive devices, conductive layers, and interlayer dielectric (ILD) layer 18 could also be formed on top of the substrate 12. More specifically, planar MOS transistors or non-planar (such as FinFETs) MOS transistors could be formed on the substrate 12, in which the MOS transistors could include transistor elements such as gate structures (for example metal gates) and source/drain region, spacer, epitaxial layer, and contact etch stop layer (CESL). The ILD layer 18 could be formed on the substrate 12 to cover the MOS transistors, and a plurality of contact plugs could be formed in the ILD layer 18 to electrically connect to the gate structure and/or source/drain region of MOS transistors. Since the fabrication of planar or non-planar transistors and ILD layer is well known to those skilled in the art, the details of which are not explained herein for the sake of brevity.

Next, metal interconnect structures 20, 22 are sequentially formed on the ILD layer 18 on the MTJ region 14 and the edge region 16 to electrically connect the aforementioned contact plugs, in which the metal interconnect structure 20 includes an inter-metal dielectric (IMD) layer 24 and metal interconnections 26 embedded in the IMD layer 24, and the metal interconnect structure 22 includes a stop layer 28, an IMD layer 30, and metal interconnections 32 embedded in the stop layer 28 and the IMD layer 30.

In this embodiment, each of the metal interconnections 26 from the metal interconnect structure 20 preferably includes a trench conductor and each of the metal interconnections 32 from the metal interconnect structure 22 on the MTJ region 14 includes a via conductor. Preferably, each of the metal interconnections 26, 32 from the metal interconnect structures 20, 22 could be embedded within the IMD layers 24, 30 and/or stop layer 28 according to a single damascene process or dual damascene process. For instance, each of the metal interconnections 26, 32 could further includes a barrier layer 34 and a metal layer 36, in which the barrier layer 34 could be selected from the group consisting of titanium (Ti), titanium nitride (TiN), tantalum (Ta), and tantalum nitride (TaN) and the metal layer 36 could be selected from the group consisting of tungsten (W), copper (Cu), aluminum (Al), titanium aluminide (TiAl), and cobalt tungsten phosphide (CoWP). Since single damascene process and dual damascene process are well known to those skilled in the art, the details of which are not explained herein for the sake of brevity. In this embodiment, the metal layers 36 are preferably made of copper, the IMD layers 24, 30 are preferably made of silicon oxide, and the stop layers 28 is preferably made of nitrogen doped carbide (NDC), silicon nitride, silicon carbon nitride (SiCN), or combination thereof.

Next, a MTJ stack 38 or stack structure is formed on the metal interconnect structure 22, a cap layer 40 is formed on the MTJ stack 38, and another cap layer 42 formed on the cap layer 40. In this embodiment, the formation of the MTJ stack 38 could be accomplished by sequentially depositing a first electrode layer 44, a fixed layer 46, a barrier layer 48, a free layer 50, and a second electrode layer 52 on the IMD layer 30. In this embodiment, the first electrode layer 44 and the second electrode layer 52 are preferably made of conductive material including but not limited to for example Ta, Pt, Cu, Au, Al, or combination thereof. The fixed layer 46 could be made of antiferromagnetic (AFM) material including but not limited to for example ferromanganese (FeMn), platinum manganese (PtMn), iridium manganese (IrMn), nickel oxide (NiO), or combination thereof, in which the fixed layer 46 is formed to fix or limit the direction of magnetic moment of adjacent layers. The barrier layer 48 could be made of insulating material including but not limited to for example oxides such as aluminum oxide ($AlO_x$) or magnesium oxide (MgO). The free layer 50 could be made of ferromagnetic material including but not limited to for example iron, cobalt, nickel, or alloys thereof such as cobalt-iron-boron (CoFeB), in which the magnetized direction of the free layer 50 could be altered freely depending on the influence of outside magnetic field. Preferably, the cap layer 40 and cap layer 42 are made of different materials. For instance, the cap layer 40 is preferably made of silicon nitride and the cap layer 42 is made of silicon oxide, but not limited thereto.

Next, a patterned mask 54 is formed on the cap layer 42. In this embodiment, the patterned mask 54 could include an organic dielectric layer (ODL) 56, a silicon-containing hard mask bottom anti-reflective coating (SHB) 58, and a patterned resist 60.

Figure 2:
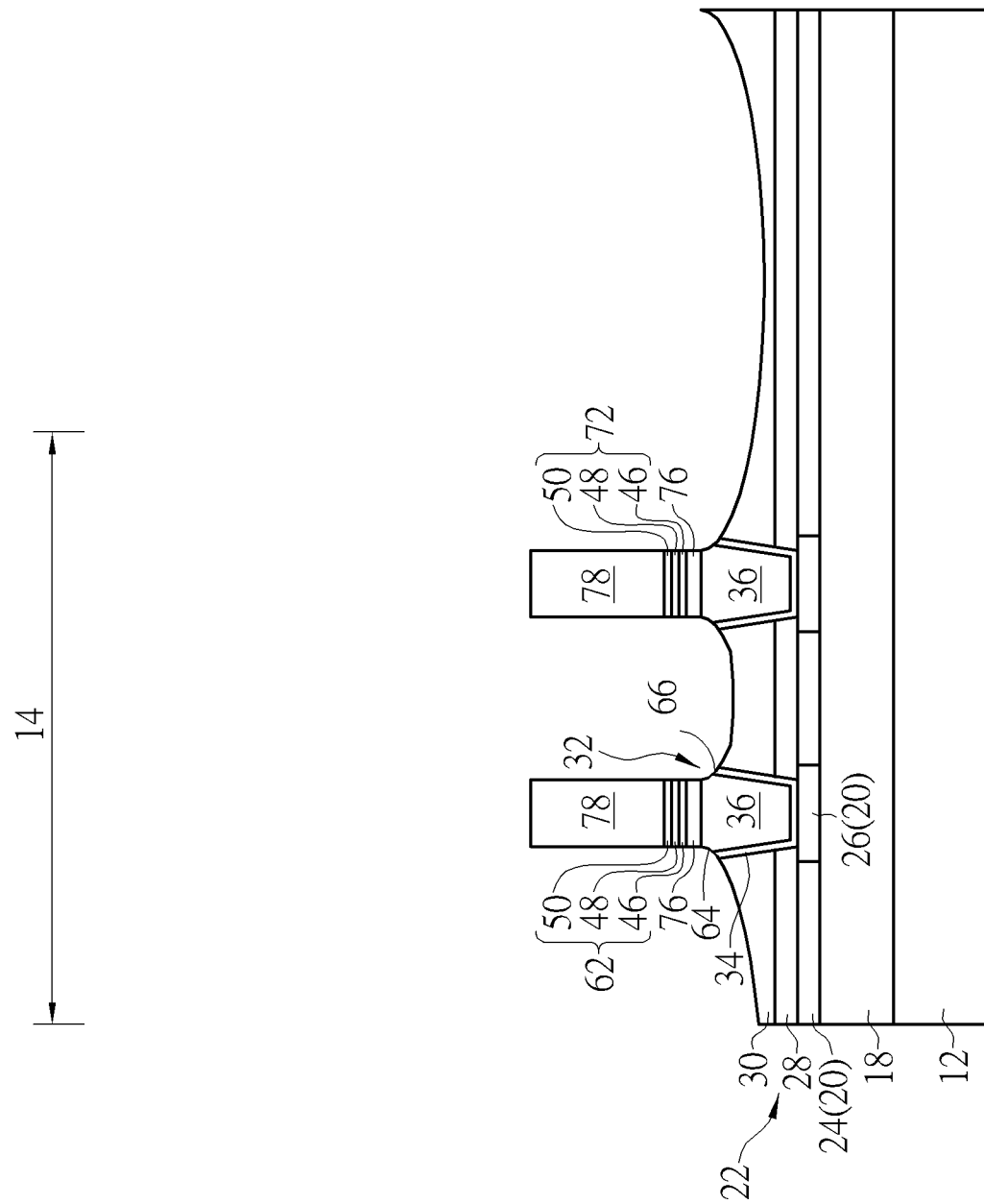

Next, as shown in FIG. 2, one or more etching process is conducted by using the patterned mask 54 as mask to remove part of the cap layers 40, 42, part of the MTJ stack 38, and part of the IMD layer 30 to form MTJ 62 and MTJ 72 on the MTJ region 14, in which the first electrode layer 44 at this stage preferably becomes a bottom electrode 76 for the MTJs 62, 72 while the second electrode layer 52 becomes a top electrode 78 for the MTJs 62, 72 and the cap layers 40, 42 could be removed during the etching process. It should be noted that this embodiment preferably conducts a reactive ion etching (RIE) process by using the patterned mask 54 as mask to remove part of the cap layers 40, 42 and part of the MTJ stack 38, strips the patterned mask 54, and then conducts an ion beam etching (IBE) process by using the patterned cap layer 42 as mask to remove part of the MTJ stack 38 and part of the IMD layer 30 to form MTJs 62, 72. Due to the characteristics of the IBE process, the top surface of the remaining IMD layer 30 is slightly lower than the top surface of the metal interconnections 32 after the IBE process and the top surface of the IMD layer 30 also reveals a curve or an arc.

It should also be noted that when the IBE process is conducted to remove part of the IMD layer 30, part of the metal interconnections 32 are removed at the same time so that a first slanted sidewall 64 and a second slanted sidewall 66 are formed on the metal interconnections 32 adjacent to the MTJ 62, in which each of the first slanted sidewall 64 and the second slanted sidewall 66 could further include a curve (or curved surface) or a planar surface.

Figure 3:
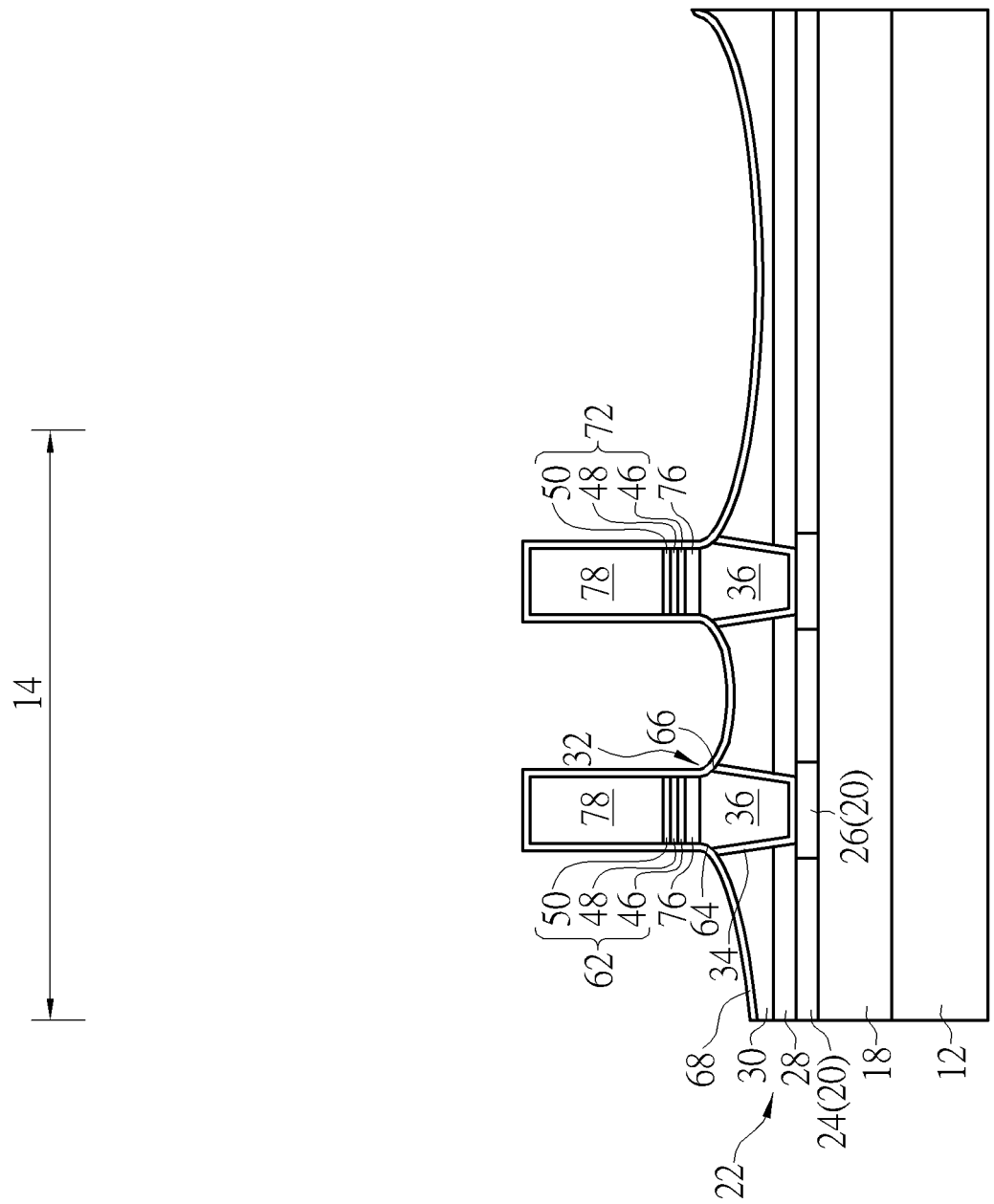

Next, as shown in FIG. 3, a liner 68 is formed on the MTJ 62, 72 to cover the surface of the IMD layer 30. In this embodiment, the liner 68 is preferably made of silicon nitride, but could also be made of other dielectric material including but not limited to for example silicon oxide, silicon oxynitride, or silicon carbon nitride.

Figure 4:
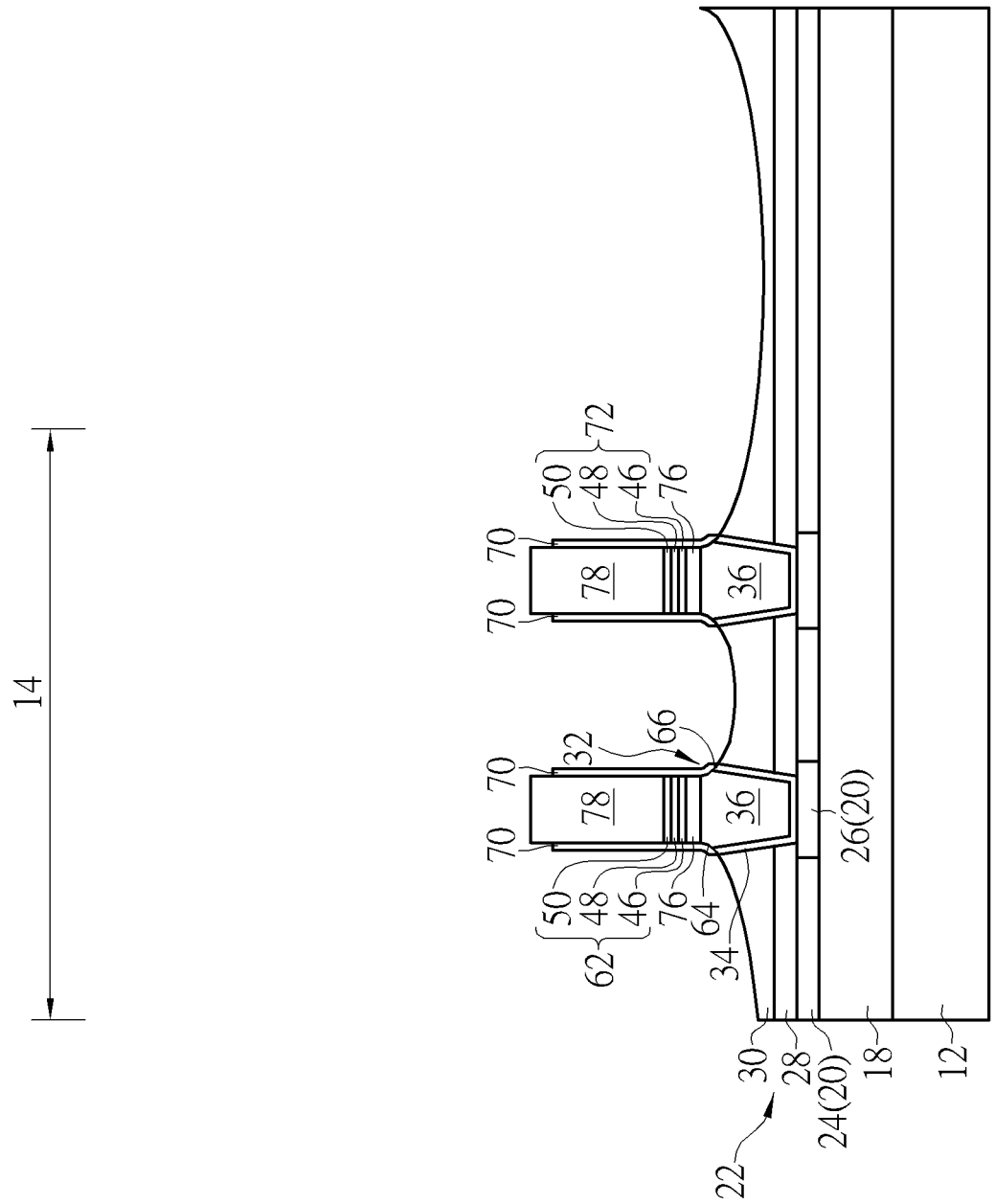

Next, as shown in FIG. 4, an etching process is conducted to remove part of the liner 68 to form a spacer 70 adjacent to each of the MTJs 62, 72, in which the spacer 70 is disposed on the sidewalls of each of the MTJs 62, 72 and at the same time covering and contacting the first slanted sidewalls 64 and second slanted sidewalls 66 of the metal interconnections 32 directly. It should also be noted that the top surface of the spacers 70 formed at this stage is slightly lower than the top surface of the top electrode 78.

Figure 5:
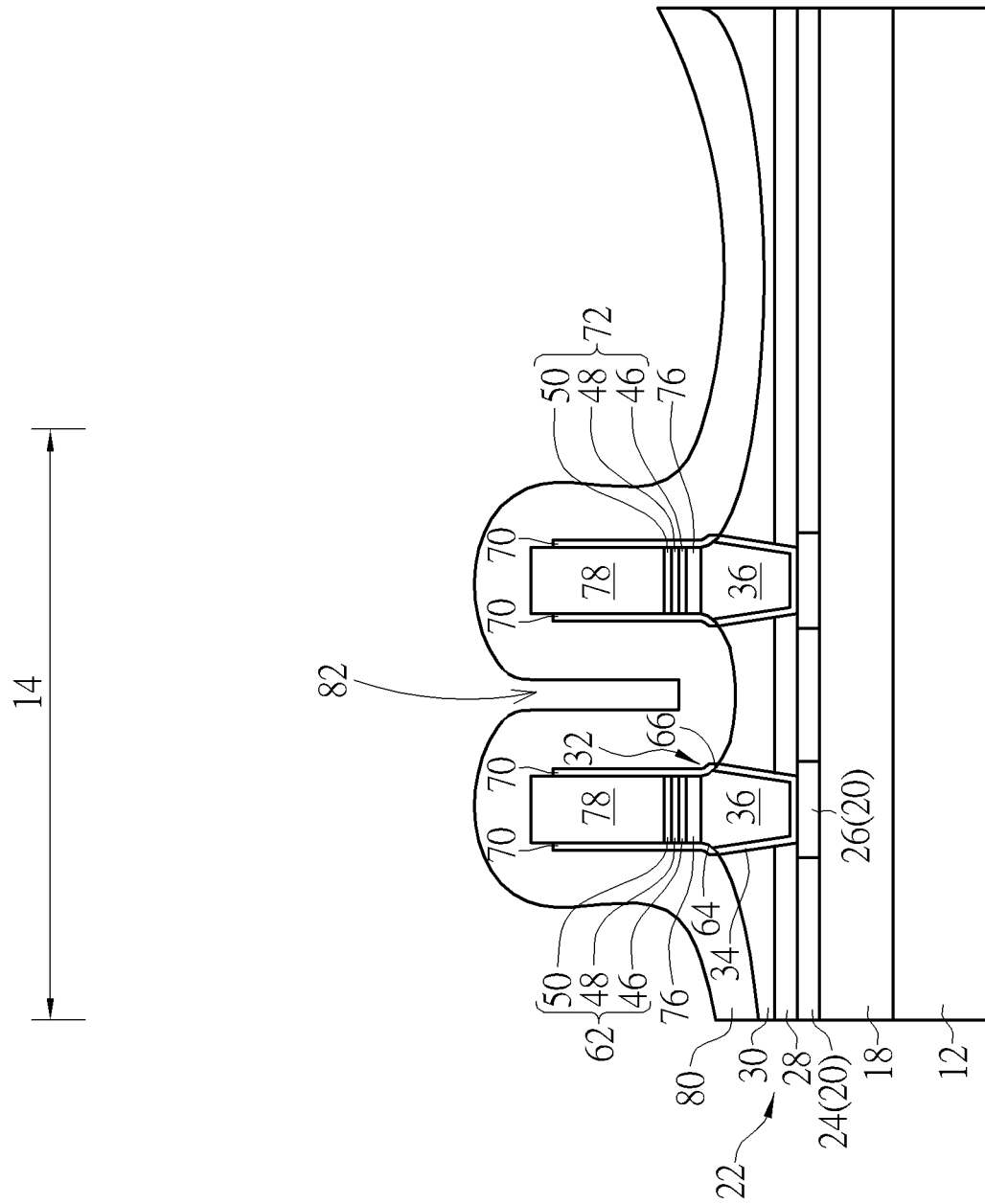

Next, as shown in FIG. 5, a first ultra low-k (ULK) dielectric layer 80 is formed on the surface of the IMD layer 30 to cover the MTJs 62, 72 and at the same time forms a recess 82 between the MTJs 62, 72. In this embodiment, the bottommost surface of the recess 82 formed between the MTJs 62, 72 is preferably lower than the top surface of the MTJs 62, 72 or more specifically lower than the bottom surface of the top electrode 78 or top surface of the free layer 50. Moreover, the bottommost surface of the recess preferably includes a planar surface while each of the left and right sidewalls of the recess 82 also includes a planar surface, in which the planar portion of the left and right sidewalls of the recess 82 could extend from the region between top and bottom surfaces of the MTJs 62, 72 upward to surpass the top surface of the top electrode 78.

Figure 6:
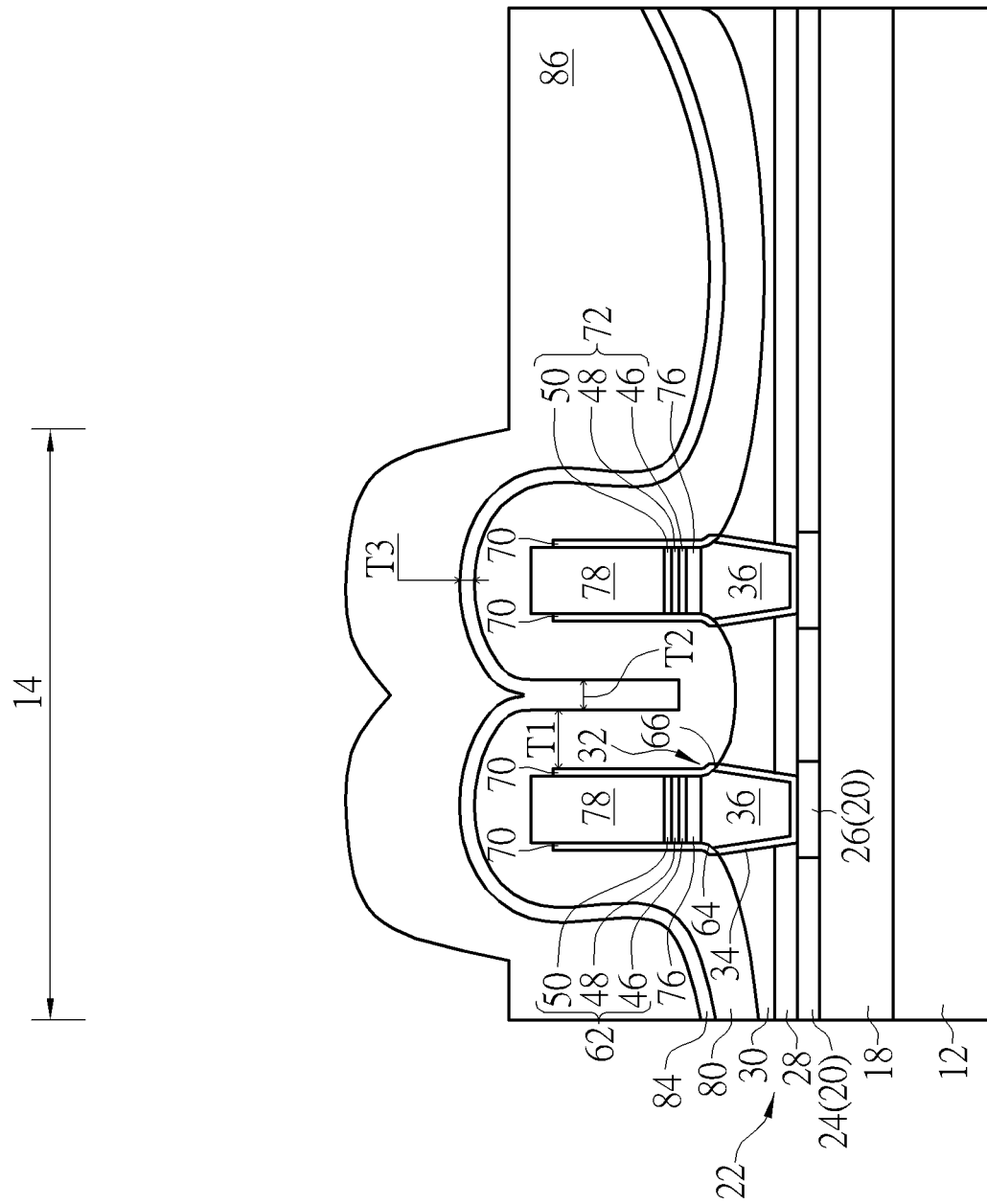

Next, as shown in FIG. 6, an atomic layer deposition (ALD) process is conducted to form a passivation layer 84 on the ULK dielectric layer 80 and filling the recess 82 completely, and a second ULK dielectric layer 86 is formed on the passivation 84 thereafter. Next, a planarizing process such as chemical mechanical polishing (CMP) process is conducted to remove part of the second ULK dielectric layer 86 and even part of the passivation layer 84 and/or first ULK dielectric layer 80, and one or more photo-etching process is conducted to remove part of the second ULK dielectric layer 86, part of the passivation layer 84, and part of the first ULK dielectric layer 80 on the MTJ region 14 to form a contact hole (not shown). Next, conductive materials are deposited into the contact hole and a planarizing process such as CMP is conducted to form metal interconnection physically contacting the MTJs 62, 72 underneath. This completes the fabrication of a MRAM device according to an embodiment of the present invention.

In this embodiment, the first ULK dielectric layer 80 and the second ULK dielectric layer 86 are preferably made of same material, the first ULK dielectric layer 80 and the passivation layer 84 are preferably made of different materials, and the second ULK dielectric layer 86 and the passivation layer 84 are preferably made of different materials, in which the first ULK dielectric layer 80 and second ULK dielectric layer 86 could include porous dielectric materials including but not limited to for example silicon oxycarbide (SiOC) while the passivation layer 84 could include tetraethyl orthosilicate (TEOS), silicon oxide, silicon nitride, or combination thereof.

Structurally, the semiconductor device shown in FIG. 6 preferably includes MTJs 62, 72 disposed on the substrate 12, top electrodes 78 disposed on the MTJs 62, 72, spacers 70 disposed on sidewalls of the MTJs 62, 72, a first ULK dielectric layer 80 disposed on the MTJs 62, 72, a passivation layer 84 disposed on the first ULK dielectric layer 80, and a second ULK dielectric layer 86 disposed on the passivation layer 84, in which the top surface of each of the spacers 70 is lower than the top surface of the top electrodes 78 and the bottom or bottommost surface of the passivation layer 84 between the MTJs 62, 72 is lower than the top surface of the MTJs 62, 72.

Viewing from a more detailed perspective, the bottom or bottommost surface of the passivation layer 84 between the MTJs 62, 72 includes a planar surface while each of the left and right sidewalls of the passivation layer 84 also includes a planar surface, in which the planar portion of the left and right sidewalls of the passivation layer 84 could extend from the region between top and bottom surfaces of the MTJs 62, 72 upward to surpass the top surface of the top electrode 78. Moreover, the first ULK dielectric layer 80 disposed on sidewalls of the MTJ 62 or MTJ 72 includes a thickness T1, the passivation layer 84 disposed between the MTJs 62, 72 includes a thickness T2, and the passivation layer 84 disposed directly on top of the first ULK dielectric layer 80 includes a thickness T3, in which the thickness T1 is preferably greater than the thickness T2 and the thickness T2 is greater than the thickness T3. In this embodiment, the thickness T1 is preferably between 900-1200 Angstroms, the thickness T2 is between 350-450 Angstroms, and the thickness T3 is less than 200 Angstroms.

Overall, the present invention first controls the height of the spacers after forming the MTJs so that the top surface of the spacers is slightly lower than the top surface of the top electrodes, and then forms a tri-layered structure including a first ULK dielectric layer, a passivation layer, and a second ULK dielectric layer on the MTJs while filling the spacer between the MTJs. Since the height of the spacers disposed on sidewalls of the MTJs is slightly lowered, it would then be desirable to form enough space including aforementioned recess having planar bottom and planar sidewalls between MTJs after the first ULK dielectric layer is disposed on top of the MTJs so that the passivation layer made of silicon oxide could be filled into the recess between the MTJs completely and formation of voids affecting performance of the device could be minimized.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device, comprising:
   a first magnetic tunneling junction (MTJ) and a second MTJ on a substrate;
   a first top electrode on the first MTJ and a second top electrode on the second MTJ;
   a first ultra low-k (ULK) dielectric layer on the first MTJ and the second MTJ;
   a passivation layer on the first ULK dielectric layer, wherein a bottom surface of the passivation layer between the first MTJ and the second MTJ is lower than a top surface of the first MTJ and the passivation layer comprises a Y-shape; and
   a second ULK dielectric layer on the passivation layer.

2. The semiconductor device of claim 1, wherein a bottom surface of the passivation layer between the first MTJ and the second MTJ comprises a planar surface.

3. The semiconductor device of claim 1, wherein a sidewall of the passivation layer between the first MTJ and the second MTJ comprises a planar surface.

4. The semiconductor device of claim 1, wherein a thickness of the first ULK dielectric layer on a sidewall of the first MTJ is greater than a thickness of the passivation layer between the first MTJ and the second MTJ.

5. The semiconductor device of claim 1, further comprising a first spacer around the first MTJ and a second spacer around the second MTJ.

6. The semiconductor device of claim 5, wherein a top surface of the first spacer is lower than a top surface of the first top electrode.

7. The semiconductor device of claim 5, wherein a top surface of the second spacer is lower than a top surface of the second top electrode.

* * * * *